(12) United States Patent
Fang et al.

(10) Patent No.: US 11,049,884 B2
(45) Date of Patent: Jun. 29, 2021

(54) DISPLAY PANEL AND METHOD OF MANUFACTURING SAME, AND DISPLAY MODULE

(71) Applicant: Wuhan China Star Optoelectronics Semiconductor Display Technology Co., Ltd., Wuhan (CN)

(72) Inventors: Liang Fang, Wuhan (CN); Ding Ding, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 57 days.

(21) Appl. No.: 16/605,213

(22) PCT Filed: Aug. 20, 2019

(86) PCT No.: PCT/CN2019/101531
§ 371 (c)(1),
(2) Date: Oct. 15, 2019

(87) PCT Pub. No.: WO2020/220519
PCT Pub. Date: Nov. 5, 2020

(65) Prior Publication Data
US 2020/0343278 A1    Oct. 29, 2020

(30) Foreign Application Priority Data
Apr. 28, 2019    (CN) .......................... 201910350383.8

(51) Int. Cl.
*H01L 27/12*    (2006.01)

(52) U.S. Cl.
CPC ...... *H01L 27/1244* (2013.01); *H01L 27/1259* (2013.01)

(58) Field of Classification Search
CPC ............. H01L 27/1244; H01L 27/1259; H01L 27/1255; H01L 27/124
See application file for complete search history.

(56) References Cited

U.S. PATENT DOCUMENTS

| 10,170,534 B1 | 1/2019 | Kim et al. |
| 2011/0062458 A1 | 3/2011 | Shimoda et al. |
| 2011/0128268 A1 | 6/2011 | Kim et al. |
| 2012/0169699 A1* | 7/2012 | Shin .................... H01L 27/3279 345/211 |

(Continued)

FOREIGN PATENT DOCUMENTS

| CN | 102024843 | 4/2011 |
| CN | 102081903 | 6/2011 |

(Continued)

*Primary Examiner* — Sitaramarao S Yechuri

(57) ABSTRACT

A display panel and a method of manufacturing same, the display module. The display panel includes a substrate; a signal wire layer disposed on the substrate. The signal wire layer includes a gate electrode layer and a source/drain electrode layer. The gate electrode includes a gate electrode and a scanning signal wire. The source/drain electrode layer includes a source electrode, a drain electrode, and a power drive wire. The display panel further includes a resistance-reduction wire disposed between the substrate and the source/drain electrode layer. The resistance-reduction wire is electrically connected to the power drive wire by a through hole.

14 Claims, 9 Drawing Sheets

(56) References Cited

U.S. PATENT DOCUMENTS

| | | |
|---|---|---|
| 2015/0372072 A1 | 12/2015 | Xiong et al. |
| 2017/0069705 A1 | 3/2017 | Cao |
| 2017/0194415 A1 | 7/2017 | Choi et al. |
| 2017/0343853 A1* | 11/2017 | Lee .................. G02F 1/133514 |
| 2018/0097047 A1 | 4/2018 | Jung et al. |
| 2018/0151828 A1 | 5/2018 | Im et al. |
| 2018/0166018 A1 | 6/2018 | Yang |
| 2018/0331169 A1 | 11/2018 | Nam et al. |
| 2019/0074304 A1* | 3/2019 | Lee ....................... H01L 21/266 |
| 2021/0013232 A1* | 1/2021 | Zang .................... H01L 27/124 |

FOREIGN PATENT DOCUMENTS

| | | |
|---|---|---|
| CN | 103927977 | 7/2014 |
| CN | 104091818 | 10/2014 |
| CN | 104465711 | 3/2015 |
| CN | 104681595 | 6/2015 |
| CN | 104733470 | 6/2015 |
| CN | 106298835 | 1/2017 |
| CN | 106935594 | 7/2017 |
| CN | 107039491 | 8/2017 |
| CN | 107610636 | 1/2018 |
| CN | 107863373 | 3/2018 |
| CN | 107887406 | 4/2018 |
| CN | 107910352 | 4/2018 |
| CN | 108122955 | 6/2018 |
| CN | 109166886 | 1/2019 |
| CN | 109509771 | 3/2019 |
| CN | 109585520 | 4/2019 |
| KR | 10-2008-0104875 | 12/2008 |
| KR | 10-2017-0013553 | 2/2017 |

\* cited by examiner

USDISPLAY PANEL AND METHOD OF MANUFACTURING SAME, AND DISPLAY MODULE

RELATED APPLICATIONS

This application is a National Phase of PCT Patent Application No. PCT/CN2019/101531 having International filing date of Aug. 20, 2019, which claims the benefit of priority of Chinese Patent Application No. 201910350383.8 filed on Apr. 28, 2019. The contents of the above applications are all incorporated by reference as if fully set forth herein in their entirety.

FIELD AND BACKGROUND OF THE INVENTION

The present invention relates to a field of display and, more particularly, to a display panel and a method of manufacturing same, and a display module.

In current display panels, a drive current is applied to the display panels to realize a display function. The drive current is transmitted from a power terminal to a source/drain electrode of an array substrate to transmit signals. However, voltage drop occurs during transmission of signals due to a resistance of the source/drain electrode, which leads to a non-uniform brightness of the display panels and decreases in quality of the display panels.

SUMMARY OF THE INVENTION

The present invention provides a display panel and a method of manufacturing same, and a display module to solve a technical problem about a nonuniform brightness of the current display panels.

To solve the above problem, technical solutions provided by the present invention are described as follows:

The present invention provides a display panel, including a substrate; and a scanning signal wire layer disposed on the substrate, wherein the scanning signal wire layer includes a gate electrode layer and a source/drain electrode layer. The gate electrode layer includes a gate electrode and a scanning signal wire. The source/drain electrode layer includes a source electrode, a drain electrode, and a power drive wire.

The display panel further includes at least one resistance-reduction wire disposed between the substrate and the source/drain electrode layer. The resistance-reduction wire is electrically connected to the power drive wire by a through hole.

According to the display panel of the present invention, the display panel includes a first resistance-reduction wire, and the first resistance-reduction wire is electrically connected to the power drive wire by a first through hole, wherein the first resistance-reduction wire is parallel to the scanning signal wire.

According to the display panel of the present invention, the first resistance-reduction wire is disposed on the same layer as the scanning signal wire.

According to the display panel of the present invention, the scanning signal wire layer includes: a first gate electrode layer including at least one first gate electrode and a scanning signal wire; a second gate electrode layer disposed on the first gate electrode layer. The second gate electrode layer includes at least one second gate electrode disposed corresponding to the first gate electrode. The first gate electrode layer and the second gate electrode layer form a storage capacitor. The first resistance-reduction wire is disposed on the same layer as the second gate electrode.

According to the display panel of the present invention, the second gate electrode layer further includes a reset signal wire. The reset signal wire is parallel to the scanning signal wire. The first resistance-reduction wire is disposed between edge lines of two adjacent pixel units and the reset signal wire.

According to the display panel of the present invention, the display panel further includes a shading layer. The shading layer is disposed between the substrate and the gate electrode layer. The first resistance-reduction wire is disposed on the same layer as the shading layer.

According to the display panel of the present invention, the display panel further includes a second resistance-reduction wire. The first resistance-reduction wire is disposed on the same layer as one of a shading layer, a first gate electrode layer, and the second gate electrode layer. The second resistance-reduction wire is disposed on the same layer as one of the shading layer, the first gate electrode layer, and the second gate electrode layer. The first resistance-reduction wire and the second resistance-reduction wire are disposed on different layers. The second resistance-reduction wire is electrically connected to the power drive wire by a second through hole.

According to the display panel of the present invention, the display panel further includes a third resistance-reduction wire. The third resistance-reduction wire is disposed on the same layer as one of the shading layer, the first gate electrode layer, and the second gate electrode layer. The first resistance-reduction wire, the second resistance-reduction wire, and the third resistance-reduction wire are disposed on different layers. The third resistance-reduction wire is electrically connected to the power drive wire by a third through hole.

The present invention further provides a method of manufacturing a display panel, including a plurality of steps of: step 10: providing a substrate; step 20: disposing a first metal layer on the substrate, and patterning the first metal layer to form a gate electrode and a scanning signal wire; and step 30: disposing a third metal layer on the first metal layer, and forming a source electrode, a drain electrode, and a power drive wire on the third metal layer; wherein the method further includes a step of: disposing at least one resistance-reduction wire between the substrate and the third metal layer. The resistance-reduction wire is electrically connected to the power drive wire by a through hole.

In the method of manufacturing a display panel according to the present invention, the step of forming at least one resistance-reduction wire between the substrate and the third metal layer includes a step of: disposing a first resistance-reduction wire between the substrate and the third metal layer. The first resistance-reduction wire is electrically connected to the power drive wire by a first through hole. The first resistance-reduction wire is parallel to the scanning signal wire.

In the method of manufacturing a display panel according to the present invention, the step 20 includes a plurality of steps of: step 201: disposing the first metal layer on the substrate; and step 202: patterning the first metal layer to form at least one first gate electrode, the scanning signal wire, and the first resistance-reduction wire.

In the method of manufacturing a display panel according to the present invention, the step 20 includes a plurality of steps of: step 211: disposing the first metal layer on the substrate; step 212: patterning the first metal layer to form at least one first gate electrode and the scanning signal wire.

step 213: disposing a second metal layer on the first metal layer; and step 214: patterning the second metal layer to form at least one second gate electrode and the first resistance-reduction wire. The first gate electrode and the second gate electrode are disposed corresponding to each other. The first gate electrode and the second gate electrode form a storage capacitor.

In the method of manufacturing a display panel according to the present invention, the step 214 includes a step of: patterning the second metal layer to form at least one second gate electrode, the first resistance-reduction wire, and a reset signal wire. The reset signal wire is parallel to the scanning signal wire. The first resistance-reduction wire is disposed between edge lines of two adjacent pixel units and the reset signal wire.

In the method of manufacturing a display panel according to the present invention, a fourth metal layer is disposed on the substrate to form a shading layer and the first resistance-reduction wire by a patterning process before the step of disposing a first metal layer on the substrate.

In the method of manufacturing a display panel according to the present invention, the step of disposing at least one resistance-reduction wire between the substrate and the third metal layer includes a plurality of steps of: disposing the first resistance-reduction wire on the substrate; and disposing a second resistance-reduction wire on the first resistance-reduction wire. The first resistance-reduction wire is disposed on the same layer as a shading layer, and the second resistance-reduction wire is disposed on the same layer as a first gate electrode layer or a second gate electrode layer, or the first resistance-reduction wire is disposed on the same layer as the first gate electrode layer, and the second resistance-reduction wire is disposed on the same layer as the second gate electrode layer. The first resistance-reduction wire is electrically connected to the power drive wire by a first through hole, and the second resistance-reduction wire is electrically connected to the power drive wire by a second through hole.

In the method of manufacturing a display panel according to the present invention, the step of disposing at least one resistance-reduction wire between the substrate and the third metal layer includes a plurality of steps of: disposing the first resistance-reduction wire on the substrate; disposing a second resistance-reduction wire on the first resistance-reduction wire; and disposing a third resistance-reduction wire on the second resistance-reduction wire. The first resistance-reduction wire is disposed on the same layer as a shading layer, the second resistance-reduction wire is disposed on the same layer as a first gate electrode layer, and the third resistance-reduction wire is disposed on the same layer as a second gate electrode layer.

The present invention further provides a display module including: a display panel; and a polarizing layer and a cover layer disposed on the display panel. The display panel includes a substrate; and a scanning signal wire layer disposed on the substrate. The scanning signal wire layer includes a gate electrode layer and a source/drain electrode layer. The gate electrode layer includes a gate electrode and a scanning signal wire. The source/drain electrode layer includes a source electrode, a drain electrode, and a power drive wire. The resistance-reduction wire is electrically connected to the power drive wire by a through hole.

According to the display module of to the present invention, the display panel includes a first resistance-reduction wire, and the first resistance-reduction wire is electrically connected to the power drive wire by a first through hole. The first resistance-reduction wire is parallel to the scanning signal wire.

According to the display module of to the present invention, the display panel further includes a second resistance-reduction wire. The first resistance-reduction wire is disposed on the same layer as one of a shading layer, a first gate electrode layer, and a second gate electrode layer. The second resistance-reduction wire is disposed on the same layer as one of the shading layer, the first gate electrode layer, and the second gate electrode layer. The first resistance-reduction wire and the second resistance-reduction wire are disposed on different layers. The second resistance-reduction wire is electrically connected to the power drive wire by a second through hole.

According to the display module of to the present invention, the display panel further includes a third resistance-reduction wire. The third resistance-reduction wire is disposed on the same layer as one of the shading layer, the first gate electrode layer, and the second gate electrode layer. The first resistance-reduction wire, the second resistance-reduction wire, and the third resistance-reduction wire are disposed on different layers. The third resistance-reduction wire is electrically connected to the power drive wire by a third through hole.

Regarding the beneficial effects of the present invention: at least one resistance-reduction wire is added to a display panel and connected to a power drive wire by a through hole. The resistance-reduction wire and the power drive wire form a grid structure, which is a parallel circuit, to transmit digital signals, thereby reducing resistance of metal wires, which are used for transmitting signals, of the display panel, decreasing a drop voltage, increasing uniformity of brightness of the display panel, and further alleviating an abnormity of open-circuit due to breakage of the metal lines.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
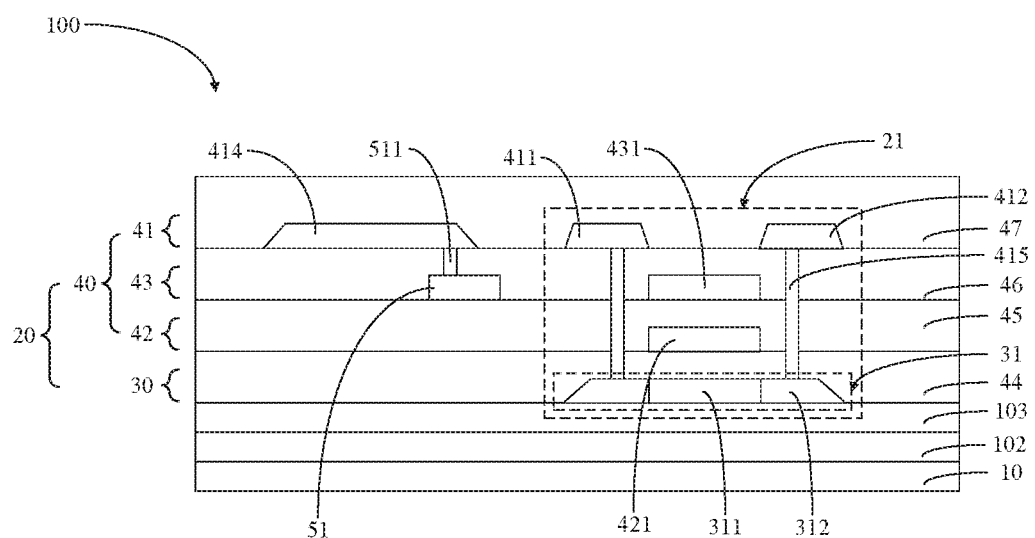
FIG. 1 is a first schematic diagram showing a laminated structure according to a display panel of the present invention.

The embodiments of the present disclosure are described in detail hereinafter. Examples of the described embodiments are given in the accompanying drawings, in the description of the present disclosure, it should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

Referring to FIG. 1, FIG. 1 is a first schematic diagram showing a laminated structure according to a display panel of the present invention.

A display panel 100 includes a substrate 10 and a thin film transistor (TFT) layer 20 disposed on the substrate 10. The TFT layer 20 includes at least two TFTs 21.

In the present embodiment, the substrate 10 can be one of a glass substrate, a quartz substrate, and a resin substrate. The substrate 10 can also be a flexible substrate, and material of the flexible substrate can include polyimide (PI).

Structure of the TFT 21 can be an etch-blocking type, a back-channel-etch type, a top-gate type, and alike, but is not limited thereto. For example, a top-gate TFT 21 includes an active layer 30 and a signal wire layer 40.

The present invention will be described by taking the top-gate TFT 21 with double gate electrodes as an example.

Referring to FIG. 1, the display panel 100 further includes a blocking layer 102 disposed on the substrate 10.

In the present embodiment, material of the blocking layer 102 can include silicon oxide.

The display panel 100 further includes a buffer layer 103 disposed on the blocking layer 102.

The buffer layer 103 is used for alleviating pressure between layers of the display panel 100. The buffer layer 103 also has a function of blocking moisture.

In the present embodiment, the buffer layer 103 can include one or more of silicon nitride and silicon oxide.

The active layer 30 is disposed on the buffer layer 103.

In the present embodiment, the active layer 30 includes a first active region 31.

The first active region 31 includes a channel region 311 and first doping regions 312 disposed on two sides of the channel region 311. The channel region 311 is blocked from the first doping regions 312 by a gate electrode layer 200 corresponding to the first doping regions 312. The first doping region 312 is formed by performing an ion doping process on locations beside two sides of the channel region 311.

Figure 2:
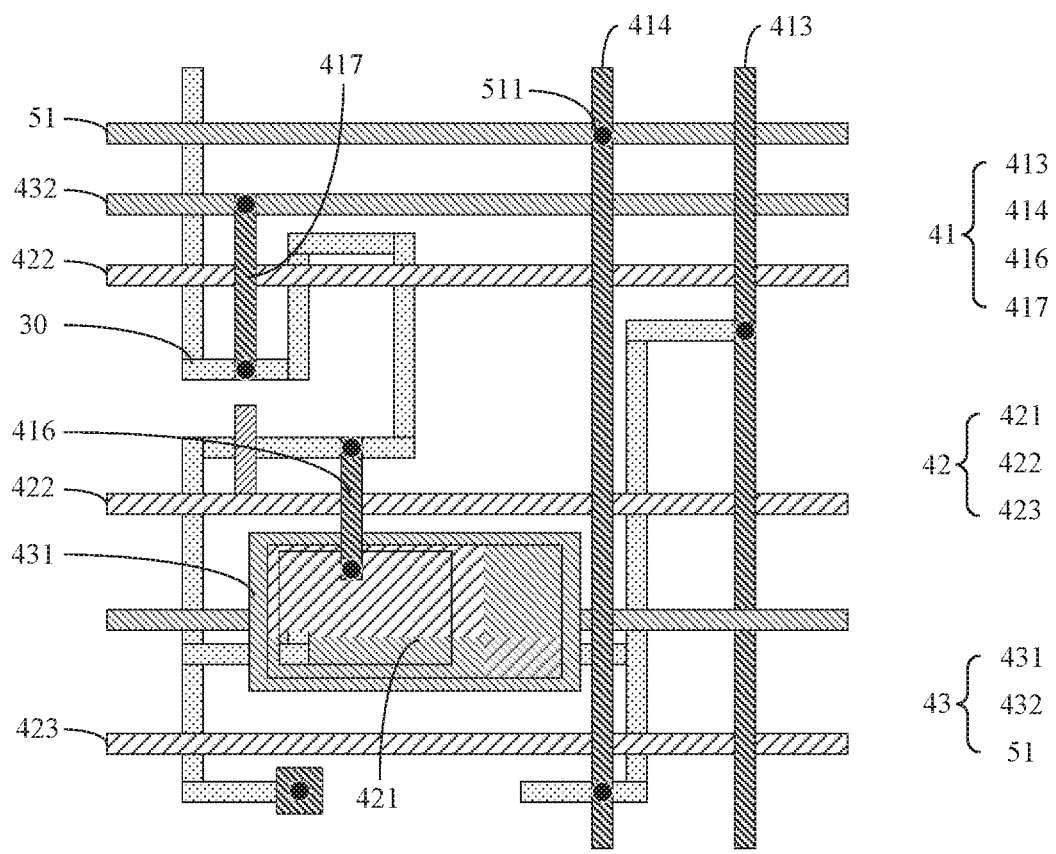
FIG. 2 is a top view of a structure of a display panel according to a display panel of the present invention.

Referring to FIG. 2, FIG. 2 is a top view of a structure of a display panel according to the present invention.

The signal wire layer 40 is disposed on the active layer 30.

The signal wire layer 40 includes a gate electrode layer 200 and a source/drain electrode layer 40.

In the present embodiment, the gate electrode layer 200 includes a gate electrode and a scanning signal wire 422.

The gate electrode layer 200 can also include a first gate electrode layer 42 and a second gate electrode layer 43.

The first gate electrode layer 42 includes at least one first gate electrode 421 and the scanning signal wire 422.

In the present embodiment, the first gate electrode 42 further includes a scanning wire 423 for controlling light emittance. The scanning wire 423 for controlling light emittance, the gate electrode 421, and the scanning signal wire 422 are formed in the same mask process.

The second gate electrode layer 43 includes at least one second gate electrode 431. The second gate electrode 431 is disposed corresponding to the first gate electrode 421.

In the present embodiment, the amount of the gate electrode layer 421 is equal to the amount of the second gate electrode layer 431. The first gate electrode 421 and the second gate electrode 431 form a storage capacitor of the TFT 21.

The source/drain electrode layer 41 is disposed on the second gate electrode layer 43.

In the present embodiment, the source/drain electrode layer includes a source electrode 411, a drain electrode 412, a digital signal wire 413, and a power drive wire 414. The source electrode 411 and the drain electrode 412 are electrically connected to the first doping region 312 by a fourth through hole 415.

Referring to FIG. 1, the display panel 100 further includes a first gate electrode insulating layer 44 disposed between the active layer 30 and the gate electrode layer 200.

The first gate electrode insulating layer 44 is disposed on the active layer 30.

The first gate electrode insulating layer 44 is used for separating the active layer 30 from a metal layer disposed on the active layer 30.

The first gate electrode layer 42 is disposed on the first gate electrode insulating layer 44.

Metal material of the first gate electrode layer 42 is usually molybdenum, aluminum, aluminum-nickel alloy, molybdenum-tungsten alloy, chromium, copper, or combinations thereof.

In the present embodiment, metal material of the first gate electrode layer 42 can be molybdenum.

The second gate electrode insulating layer 45 is disposed on the first gate electrode layer 42.

The second gate electrode insulating layer 45 is used for separating the first gate electrode layer 42 from the second gate electrode layer 43.

In the present embodiment, material of the first gate electrode insulating layer 44 and the second gate electrode insulating layer 45 can be silicon nitride, silicon oxide, silicon oxynitride, or other insulating inorganic materials.

The second gate electrode layer 43 is disposed on the second gate electrode insulating layer 45.

In the present embodiment, metal material of the second gate electrode layer 43 is usually the same as that of the first gate electrode layer 42.

An inter-line insulating layer 46 is disposed on the second gate electrode layer 43.

The inter-line insulating layer 46 covers the second gate electrode layer 43, and is used for separating the second gate electrode layer 43 from the source/drain electrode layer 41.

In the present embodiment, material of the inter-line insulating layer 46 can be the same as that of the first gate electrode insulating layer 44 and that of the second gate electrode insulating layer 45.

The source/drain electrode layer 41 is disposed on the inter-line insulating layer 46.

Metal material of the source/drain electrode layer 41 can be molybdenum, aluminum, aluminum-nickel alloy, molybdenum-tungsten alloy, chrome, copper, titanium aluminum alloy, or combinations thereof.

In the present embodiment, metal material of the source/drain electrode layer 41 can be titanium aluminum alloy.

The display panel 100 further includes a planarization layer 47 disposed on the source/drain electrode layer 41.

The planarization layer 47 is used for ensuring flatness of a layer of an array substrate. The planarization layer 47 is usually made of organic materials.

The display panel 100 further includes a light-emitting device layer (not shown) and an encapsulation layer (not shown) which are disposed on the planarization layer 47.

The display panel 100 includes at least one resistance-reduction wire 50.

The resistance-reduction wire 50 is disposed between the substrate 10 and the source/drain electrode layer 41. The resistance-reduction wire 50 is electrically connected to the power drive wire 414 by a through hole.

Referring to FIG. 1, the display panel 100 includes a first resistance-reduction wire 51. The first resistance-reduction wire 51 is electrically connected to the power drive wire 414 by a first through hole 511.

In the present embodiment, the first resistance-reduction wire 51 is disposed on the same layer as the second gate electrode layer 43. The first resistance-reduction wire 51 and the second gate electrode 431 are formed in the same mask process In the present embodiment, the first through hole 511 passes through portions of the inter-line insulating layer 46

The first resistance-reduction wire 51 and the scanning signal wire 422 are formed in the same mask process, and the first resistance-reduction wire 51 is parallel to the scanning signal wire 422.

The first resistance-reduction layer 51 is electrically connected to the power drive wire 414 by the first through hole 511, thereby making the first resistance-reduction layer 51 and the power drive wire 414 form a grid structure, which is a parallel circuit, to transmit digital signals. As a result, resistance value of metal wires, which are used for transmitting digital signals, of the display panel 100 are reduced, voltage drop is decreased, and uniformity of brightness of the display panel 100 is improved. Furthermore, design of the grid structure can also alleviate an abnormality of open-circuit due to breakage of the metal lines.

Figure 3:
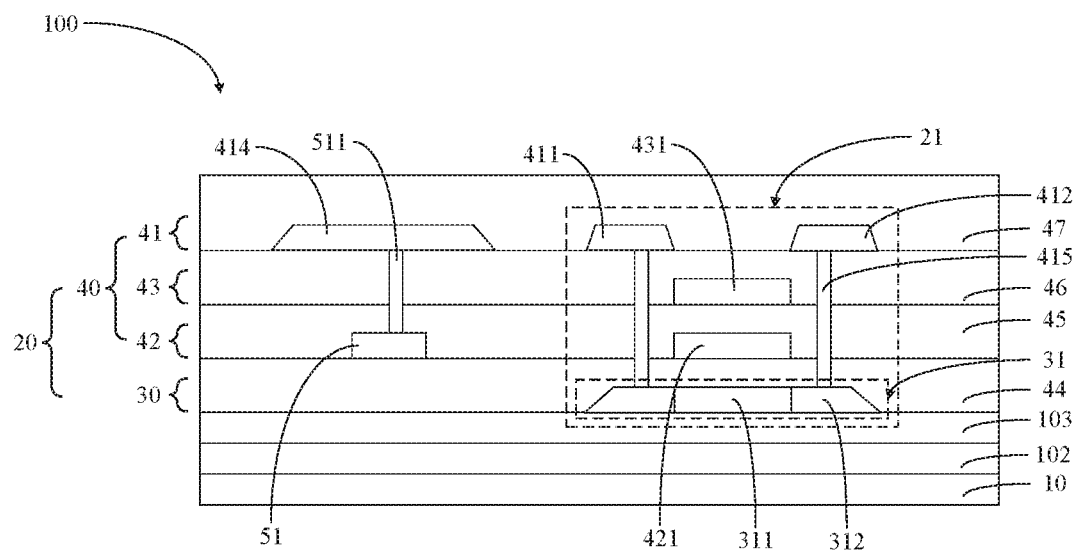
FIG. 3 is a second schematic diagram showing a laminated structure according to a display panel of the present invention.

Referring to FIG. 3, FIG. 3 is a second schematic diagram showing a laminated structure according to a display panel of the present invention.

The first resistance-reduction wire 51 is disposed on the same layer as the scanning signal wire 422. The first resistance-reduction wire 51, the scanning signal wire 422, and the first gate electrode 421 are formed in the same mask process.

In the present embodiment, the first through hole 511 passes through the inter-line insulating layer 46 and portions of the second gate electrode insulating layer 45.

Figure 4:
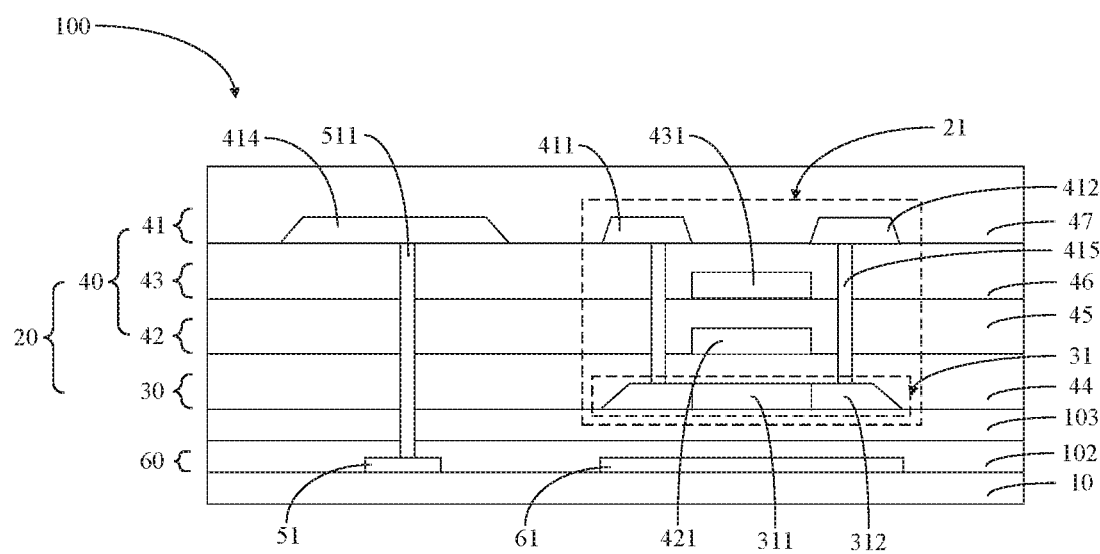
FIG. 4 is a third schematic diagram showing a laminated structure according to a display panel of the present invention.

Referring to FIG. 4, FIG. 4 is a third schematic diagram showing a laminated structure according to a display panel of the present invention.

The display panel 100 further includes a shading layer 60.

The shading layer 60 is disposed between the substrate 10 and the gate electrode layer 200.

In the present embodiment, the shading layer 60 forms a shading region 61 and the first resistance-reduction wire 51 by performing a patterning process on a metal layer.

The first resistance-reduction wire 51 is electrically connected to the power drive wire 414 by the first through hole 511.

In the present embodiment, the first through hole 511 passes through the inter-line insulating layer 46, the second gate electrode insulating layer 45, the first gate electrode insulating layer 44, the buffer layer 103, and portions of blocking layer 102.

In the present embodiment, a position where the shading layer 60 is disposed is not limited.

As shown in FIG. 1 to FIG. 4, the display panel 100 further includes a reset signal wire 432.

The reset signal wire 432 and the second gate electrode 431 are formed in the same mask process. The reset signal wire 432 is disposed on the same layer as the second gate electrode layer 43.

In the present embodiment, the reset signal wire 432 is parallel to the scanning signal wire 422.

In the present embodiment, the first resistance-reduction wire 51 is disposed between edge lines of two adjacent pixel units and the reset signal wire 432.

Figure 5:
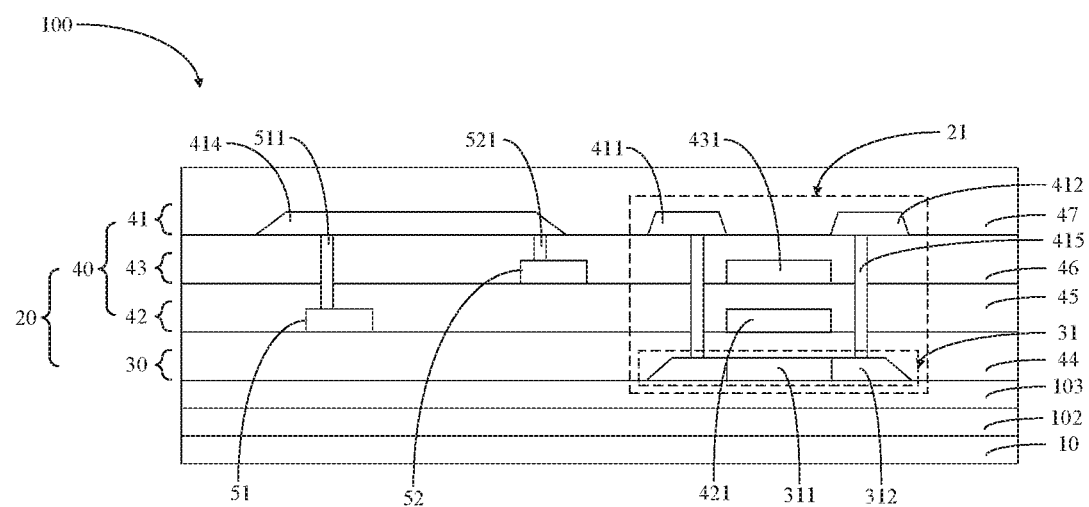
FIG. 5 is a fourth schematic diagram showing a laminated structure according to a display panel of the present invention.

Referring to FIG. 5, FIG. 5 is a fourth schematic diagram showing a laminated structure according to a display panel of the present invention.

Based on FIG. 1, FIG. 3, or FIG. 4, the display panel further includes a second resistance-reduction wire 52.

The first resistance-reduction wire 51 is disposed on the same layer as one of the shading layer 60, the first gate electrode layer 42, and the second gate electrode layer 43.

The second resistance-reduction wire 52 is disposed on the same layer as one of the shading layer 60, the first gate electrode layer 42, and the second gate electrode layer 43.

The first resistance-reduction wire 51 is not disposed on the same layer as the second resistance-reduction wire 52.

The second resistance-reduction wire 52 is electrically connected to the power drive wire 414 by a second through hole 521.

In the present embodiment, the first resistance-reduction wire 51 is disposed on the same layer as the first gate electrode layer 42, and the second resistance-reduction wire 52 is disposed on the same layer as the second gate electrode layer 43.

In the present embodiment, the second resistance-reduction wire 52 is parallel to the first resistance-reduction wire 51.

Figure 6:
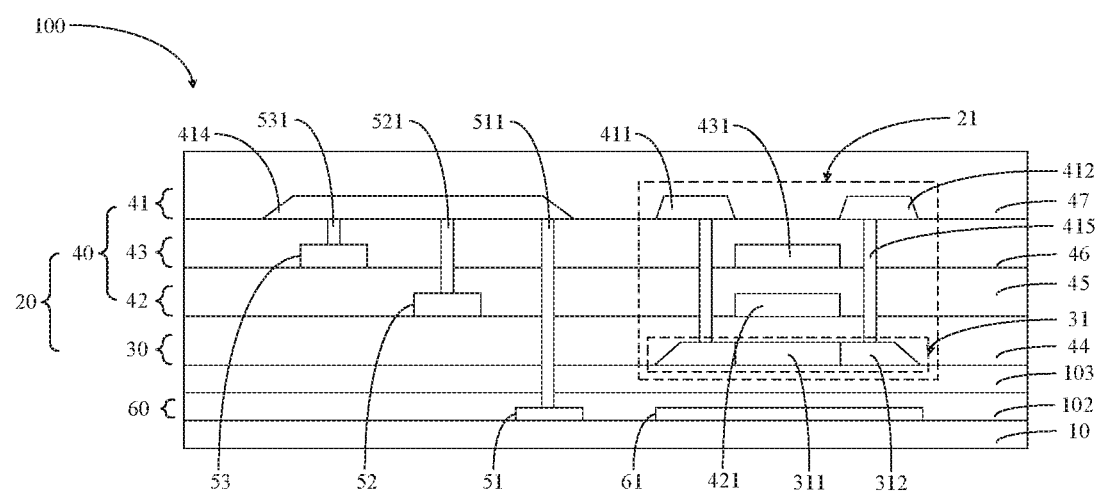
FIG. 6 is a fifth schematic diagram showing a laminated structure according to a display panel of the present invention.

Referring to FIG. 6, FIG. 6 is a fifth schematic diagram showing a laminated structure according to a display panel of the present invention.

Based on FIG. 5, the display panel further includes a third resistance-reduction wire 53.

The third resistance-reduction 53 is disposed on the same layer as one of the shading layer 60, the first gate electrode layer 42, and the second gate electrode layer 43.

The first resistance-reduction wire 51, the second resistance-reduction wire 52, and the third resistance-reduction wire 53 are disposed on the different layers.

The third resistance-reduction wire 53 is electrically connected to the power drive wire 414 by a third through hole 531.

In the present embodiment, the first resistance-reduction wire 51 is disposed on the same layer as the shading layer 60, the second resistance-reduction wire 52 is disposed on the same layer as the first gate electrode layer 42, and the third resistance-reduction wire 53 is disposed on the same layer as the second gate electrode layer 43.

In the present embodiment, the third resistance-reduction wire 53 is parallel to the first resistance-reduction wire 51 and the second resistance-reduction wire 52.

In the above embodiments, the first resistance-reduction wire 51, the second resistance-reduction wire 52, and the third resistance-reduction wire 53 are perpendicular to the power drive wire 414 and are electrically connected to the power drive wire 414 by through holes respectively corresponding thereto. As a result, resistance value of the digital signal wire 413 is reduced. The amount and the position of the resistance-reduction wire 50 can be decided according to space and structure of layers.

Figure 7:
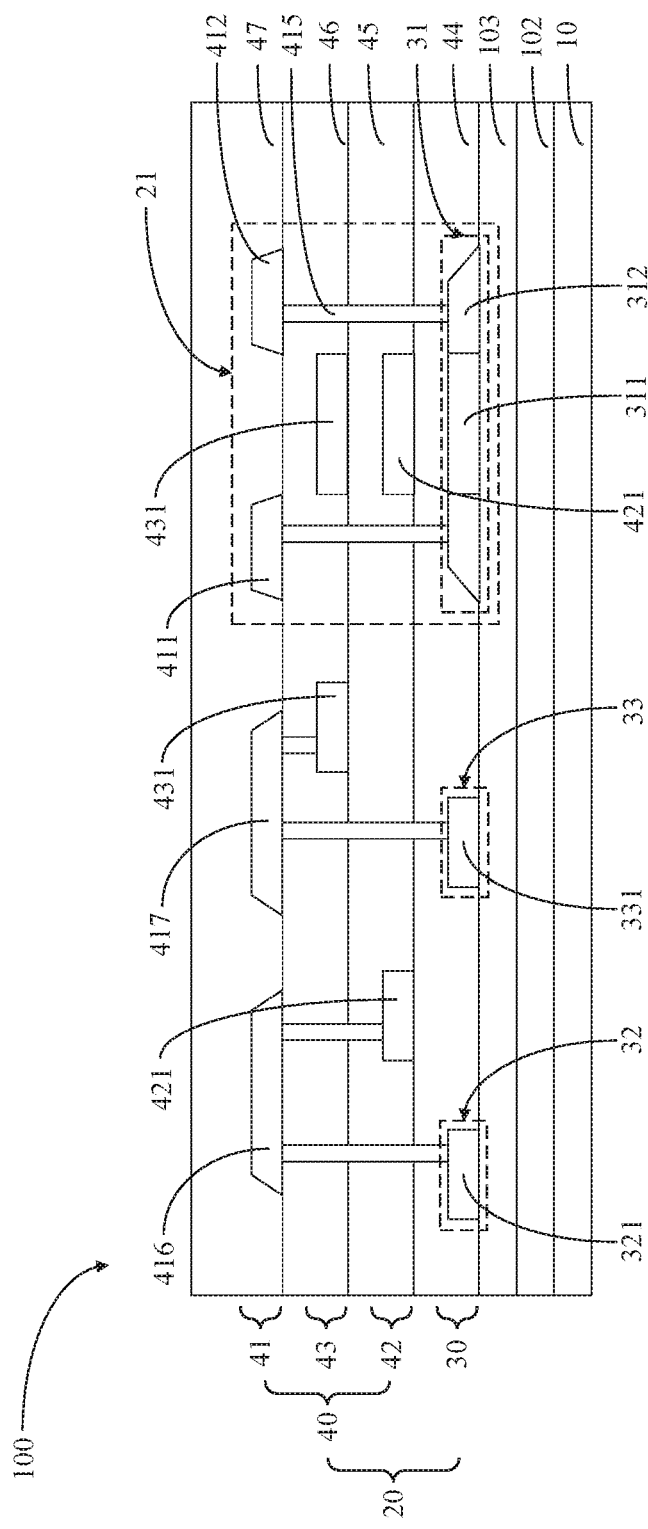
FIG. 7 is a sixth schematic diagram showing a laminated structure according to a display panel of the present invention.

Referring to FIG. 7, FIG. 7 is a sixth schematic diagram showing a laminated structure according to a display panel of the present invention.

The active layer 30 can also include a second active region 32 and a third active region 33.

The second active region 32 includes a second doping region 321.

The third active region 33 includes a third doping region 331.

The source/drain electrode layer 41 further includes a first connecting metal wire 416 and a second connecting metal wire 417 which are disposed on the same layer as the source electrode 411 and the drain electrode 412.

The first connecting metal wire 416 is simultaneously electrically connected to the second doping region 321 and the first gate electrode 421 by through holes respectively corresponding thereto.

The second connecting metal wire 417 is simultaneously electrically connected to the third doping region 331 and the second gate electrode 431 by through holes respectively corresponding thereto.

Function of the above structure is similar to function of the TFT 21 which ensures that brightness of the display panel 100 is uniform. A pixel unit may be provided with one or more of the above structures, whereas the pixel unit may also be provided with none of the above structure. The number of the above structure is not specifically limited in the present invention.

In the present invention, at least one resistance-reduction wire 50 is added to a display panel 100 and connected to a power drive wire 414 by a through hole. The resistance-reduction wire 50 and the power drive wire 414 form a grid structure, which is a parallel circuit, to transmit digital signals, thereby reducing resistance of metal wires, which are used for transmitting signals, of the display panel 100, decreasing a drop voltage, and increasing uniformity of brightness of the display panel 100.

Figure 8:
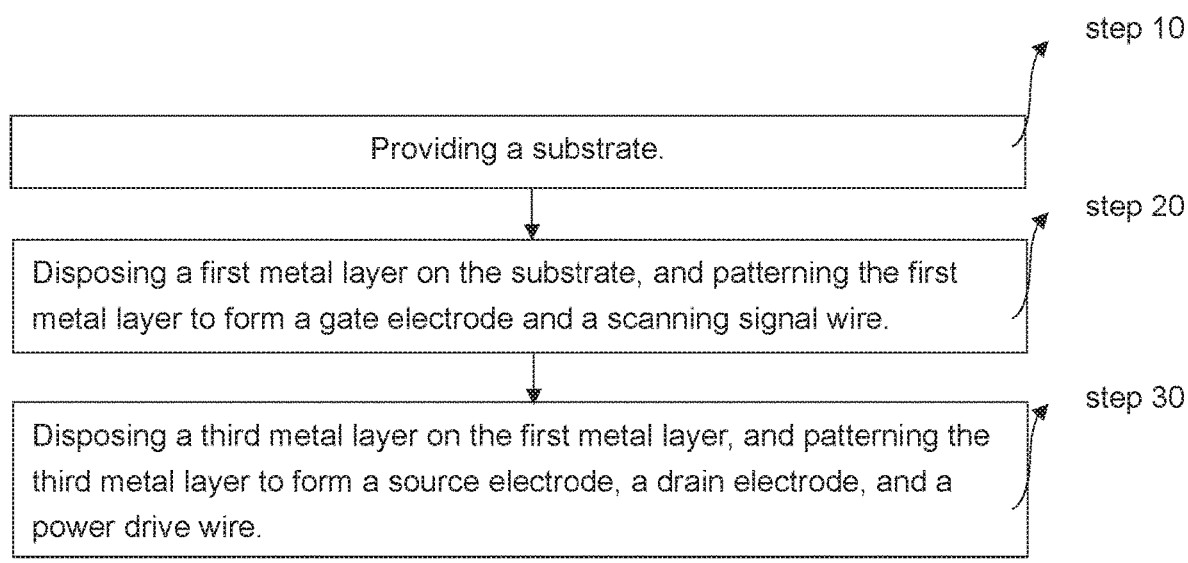
FIG. 8 is a flowchart showing a method of manufacturing a display panel according to the present invention.

Referring to FIG. 8, FIG. 8 is a flowchart showing a method of manufacturing a display panel according to the present invention.

Referring to FIG. 9A to 9I, FIG. 9A to 9I are process steps diagrams showing a method of manufacturing a display panel according to the present invention.

The display panel 100 includes a substrate 10 and a thin film transistor (TFT) layer 20 disposed on the substrate 10. Structure of the TFT 21 can be an etch-blocking type, a back-channel-etch type, a top-gate type, and alike, but is not limited thereto. For example, a top-gate TFT 21 includes a blocking layer 102, a buffer layer 103, an active layer 30, a signal wire layer 40, and a planarization layer 47.

The present invention will be described by taking the top-gate TFT 21 with double gate electrodes as an example.

The method of manufacturing the top-gate TFT 21 includes: step 10: providing a substrate 10.

Figure 9A:
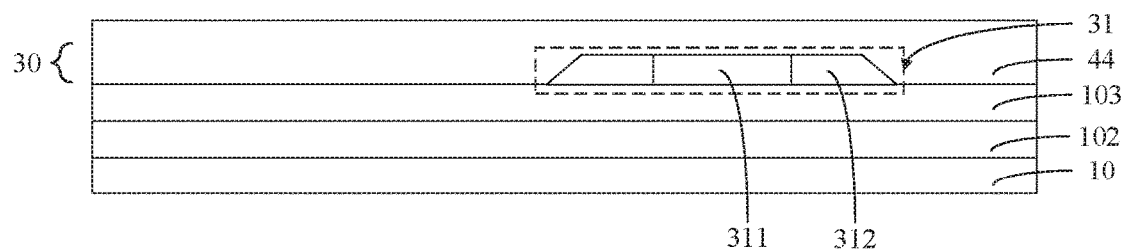
FIGS. 9A, 9B, 9C, 9D, 9E, 9F, 9G, 9H and 9I are process steps diagrams showing a method of manufacturing a display panel according to the present invention.

Referring to FIG. 9A, the substrate 10 can be one of a glass substrate, a quartz substrate, and a resin substrate. The substrate 10 can also be a flexible substrate, and material of the flexible substrate can include polyimide (PI).

The step 10 further includes: step 101: forming a blocking layer 102 on the substrate 10; step 102: forming a buffer layer 103 on the blocking layer 102; and step 103: forming an active layer 30 on the buffer layer 103.

In the present embodiment, material of the blocking layer 102 can include silicon oxide.

The buffer layer 103 is disposed on the blocking layer 102. The buffer layer 103 is used for alleviating pressure between layers of the display panel 100. The buffer layer 103 also has a function of blocking moisture.

In the present embodiment, the buffer layer 103 can include one or more of silicon nitride and silicon oxide.

The active layer 30 is disposed on the buffer layer 103.

In the present embodiment, the active layer 30 includes a first active region 31.

The first active region 31 includes a channel region 311 and first doping regions 312 disposed on two sides of the channel region 311. The channel region 311 is blocked from the first doping regions 312 by a gate electrode layer 200 corresponding to the first doping regions 312. The first doping region 312 is formed by performing an ion doping process on locations beside two sides of the channel region 311.

The method of manufacturing the top-gate TFT 21 also includes: step 20: disposing a first metal layer on the substrate 10, and patterning the first metal layer to form a gate electrode and a scanning signal wire 422.

A first gate electrode insulating layer 44 is disposed on the active layer 30 before forming the first metal layer.

In the present embodiment, the first gate electrode insulating layer 44 is used for separating the active layer 30 from a metal layer disposed on the active layer 30.

Figure 9B:
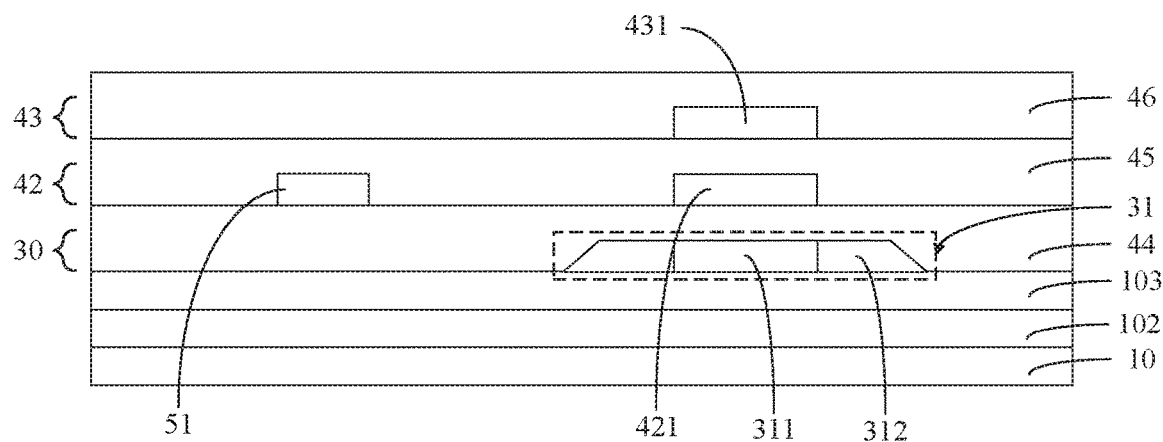

Referring to FIG. 9B, the step 20 can include: step 201: disposing the first metal layer on the substrate 10; step 202: patterning the first metal layer to form at least one gate electrode 421, the scanning signal wire 422, and at least one resistance-reduction wire 51; step 203: disposing a second metal layer on the first metal layer; step 204: patterning the second metal layer to form at least one second gate electrode 431.

In the present embodiment, the number of the first gate electrode 421 is equal to the number of the second gate electrode 431. The first gate electrode 421 is disposed corresponding to the second gate electrode 431. The first gate electrode 421 and the second gate electrode 431 form a storage capacitor of the TFT 21.

In the present embodiment, the first metal layer forms a first gate electrode layer 42, and the second metal layer forms a second gate electrode layer 43.

In the present embodiment, the first gate electrode layer 42 is disposed on the first gate electrode insulating layer 44.

Metal material of the first gate electrode layer 42 is usually molybdenum, aluminum, aluminum-nickel alloy, molybdenum-tungsten alloy, chromium, copper, or combinations thereof.

In the present embodiment, metal material of the first gate electrode layer 42 can be molybdenum.

The second gate electrode insulating layer 45 is disposed between the first gate electrode layer 42 and the second gate electrode layer 43. The second gate electrode insulating layer 45 is used for separating the first gate electrode layer 42 from the second gate electrode layer 43.

In the present embodiment, material of the first gate electrode insulating layer 44 and the second gate electrode insulating layer 45 can be silicon nitride, silicon oxide, silicon oxynitride, or other insulating inorganic materials.

The second gate electrode layer 43 is disposed on the second gate electrode insulating layer 45.

In the present embodiment, metal material of the second gate electrode layer 43 is usually the same as that of the first gate electrode layer 42.

In the present embodiment, the step 20 further includes: step 205: disposing an inter-line insulating layer 46 on the second gate electrode layer 43.

The inter-line insulating layer 46 covers the second gate electrode layer 43, and is used for separating the second gate electrode layer 43 from a source/drain electrode layer 41.

In the present embodiment, material of the inter-line insulating layer 46 can be the same as that of the first gate insulating electrode layer 44 and that of the second gate insulating electrode layer 45.

The method of manufacturing the display panel 100 further includes: step 30: disposing a third metal layer on the first metal layer, and patterning the third metal layer to form a source electrode 411, a drain electrode 412, and a power drive wire 414.

Figure 9C:
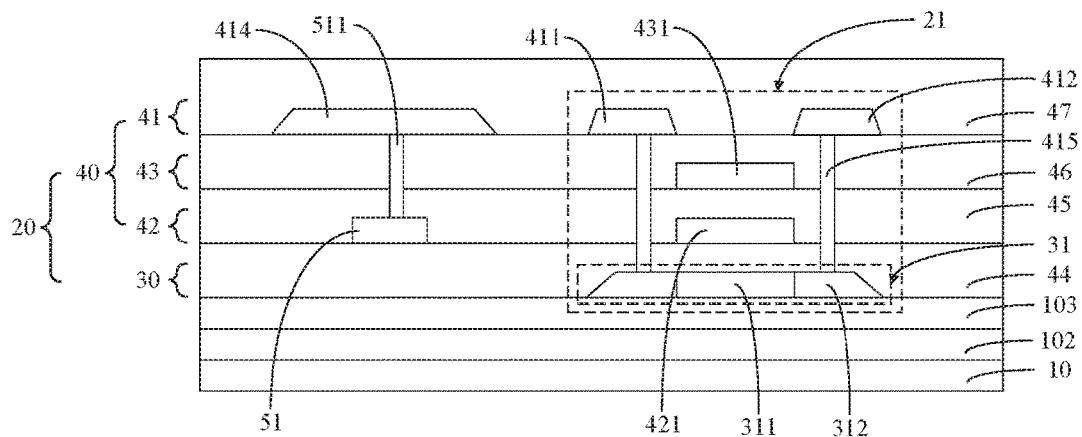

Referring to FIG. 9C, the step 30 can include: step 301: disposing the third metal layer on the substrate 10; and step 302: patterning the third metal layer to form the source electrode 411, the drain electrode 412, a digital signal wire 413, and the power drive wire 414.

In the present embodiment, the third metal layer forms the source/drain electrode layer 41 of the display panel 100. Metal material of the source/drain electrode layer 41 can be molybdenum, aluminum, aluminum-nickel alloy, molybdenum-tungsten alloy, chrome, copper, titanium aluminum alloy, or combinations thereof.

In the present embodiment, metal material of the source/drain electrode layer 41 can be titanium aluminum alloy.

A step of defining a first through hole 511 on the display panel 100 is performed before forming the third metal layer.

The first through hole 511 passes through the inter-line insulating layer 46 and portions of the second gate electrode insulating layer 45, thereby exposing portions of the first resistance-reduction wire 51. The power drive wire 414 is electrically connected to the first resistance-reduction wire 51 by the first through hole 511.

Referring to FIG. 2, the first resistance-reduction wire 51 and the scanning signal wire 422 are formed in the same mask process, and the first resistance-reduction wire 51 is parallel to the scanning signal wire 422.

The first resistance-reduction layer 51 is electrically connected to the power drive wire 414 by the first through hole 511, thereby making the first resistance-reduction layer 51 and the power drive wire 414 form a grid structure, which is a parallel circuit, to transmit digital signals. As a result, resistance value of metal lines, which are used for transmitting digital signals, of the display panel 100 are reduced, voltage drop is decreased, and uniformity of brightness of the display panel 100 is improved.

Referring to FIG. 9C, a step of disposing a planarization layer 47 on the source/drain electrode layer 41 is performed before forming the third metal layer.

The planarization layer 47 is used for ensuring flatness of a layer of an array substrate. The planarization layer 47 is usually made of organic materials.

Figure 9D:
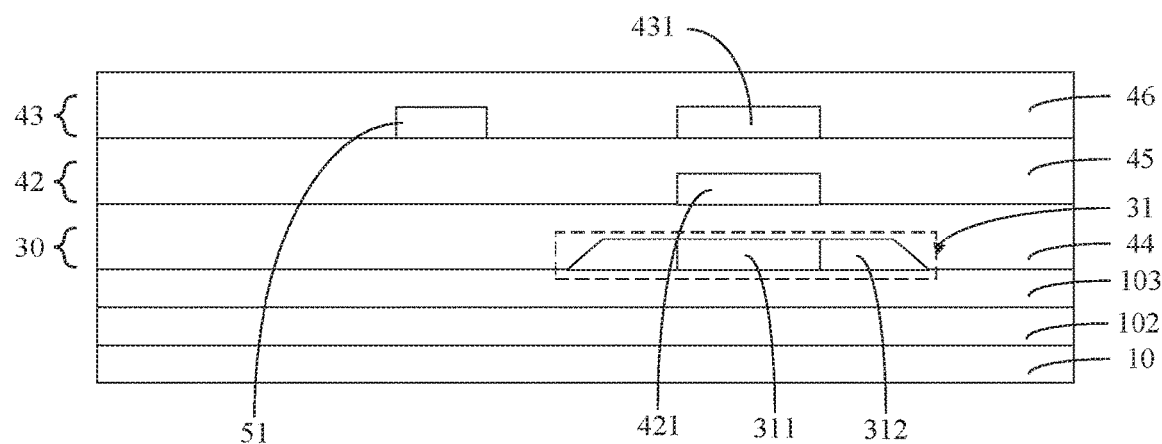

Referring to FIG. 9D, step 20 can include: step 211: disposing the first metal layer on the substrate 10; step 212: patterning the first metal layer to form at least one first gate electrode 421 and scanning signal wire 422; step 213: disposing a second metal layer on the first metal layer; and step 214: patterning the second metal layer to form at least one second gate electrode 431 and at least one first resistance-reduction wire 51.

In the present embodiment, the first resistance-reduction wire 51 is disposed on the same layer as the second gate electrode layer 43. The first resistance-reduction wire 51 and the second gate electrode 431 is formed in the same mask process.

Figure 9E:
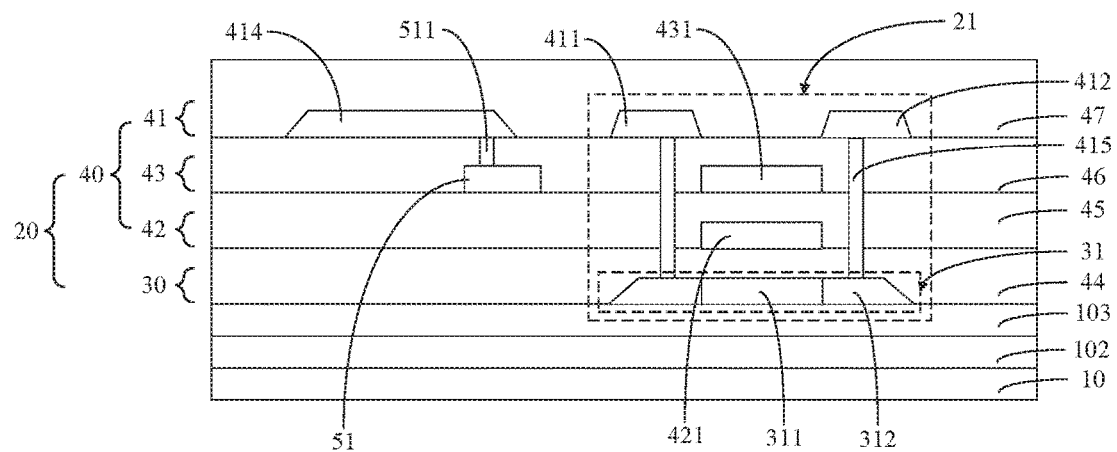

Base on FIG. 9D and referring to FIG. 9E, the first through hole 511 passes through portions of the inter-line insulating layer 46. The first resistance-reduction wire 51 is electrically connected to the power drive wire 414 by the first through hole 511.

Figure 9F:
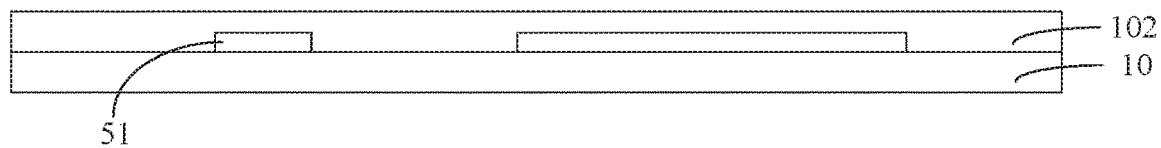

Referring to FIG. 9F, before forming the first metal layer, the step 10 includes: disposing a fourth metal layer on the substrate 10; and patterning the fourth metal layer to form a shading layer 60 and at least one resistance-reduction wire 51.

In the present embodiment, a position where the shading layer 60 is disposed is not limited.

Figure 9G:
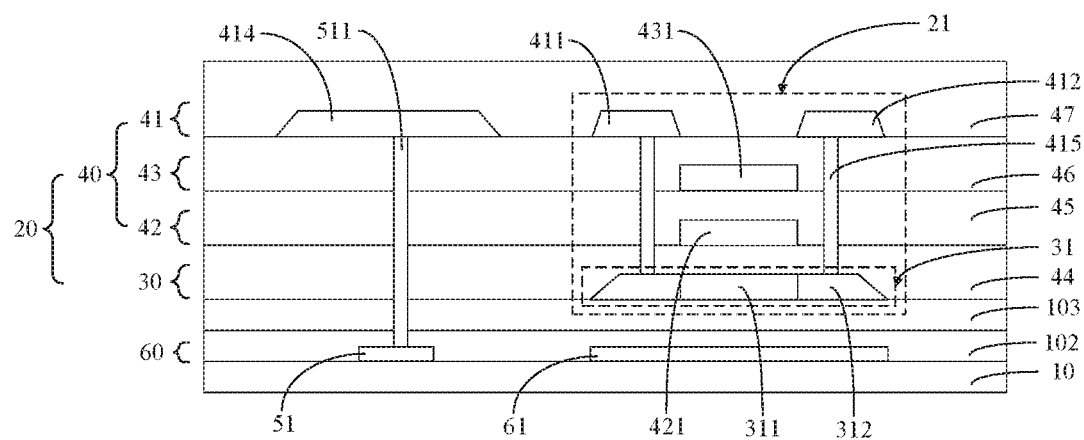

Based on FIG. 9F and referring to FIG. 9G, the first through hole 511 passes through the inter-line insulating layer 46, the second gate electrode insulating layer 45, the first gate electrode insulating layer 44, the buffer layer 103, and portions of the blocking layer 102.

In the present embodiment, the step 204 can further include: patterning the second metal layer to form at least one second gate electrode 431 and a reset signal wire, or the step 214 can further include: patterning the second metal layer to form at least one second gate electrode 431, the first resistance-reduction wire 51, and a reset signal wire.

The reset signal wire and the second gate electrode 431 are formed in the same mask process. The reset signal wire is disposed on the same layer as the second gate electrode layer 43.

In the present embodiment, the reset signal wire is parallel to the scanning signal wire 422.

In the present embodiment, the first resistance-reduction wire 51 is disposed between edge lines of two adjacent pixel units and the reset signal wire.

In the present embodiment, the first gate electrode layer 42 can further include a scanning wire 423 for controlling light emittance. The scanning wire 423 for controlling light emittance is formed in the same mask process as the first gate electrode 421 and the scanning signal wire 422.

Figure 9H:
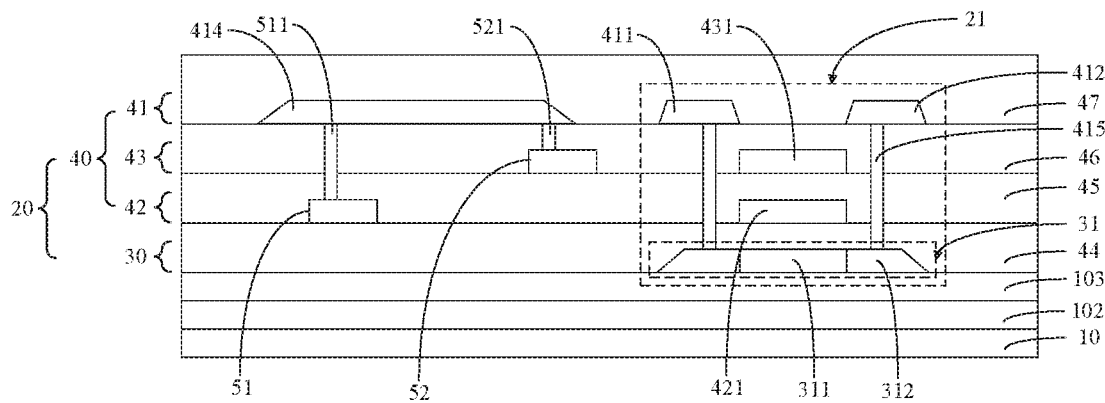

Referring to FIG. 9H, the method of manufacturing the display panel 100 can further include: disposing a first resistance-reduction wire 51 on the substrate 10; and disposing a second resistance-reduction 52 on the first resistance-reduction wire 51.

The first resistance-reduction wire 51 is disposed on the same layer as the shading layer 60. The second resistance-reduction wire 52 is disposed on the same layer as the first gate electrode layer 42 or the second gate electrode layer 43, or the first resistance-reduction wire 51 is disposed on the same layer as the first gate electrode layer 42, and the second resistance-reduction wire 52 is disposed on the same layer as the second gate electrode layer 43.

The first resistance-reduction wire 51 is electrically connected to the power drive wire 414 by a first through hole 511, and the second resistance-reduction wire 52 is electrically connected to the power drive 414 by a second through hole 521.

In the present embodiment, the second resistance-reduction wire 52 is parallel to the first resistance-reduction wire 51.

Figure 9I:
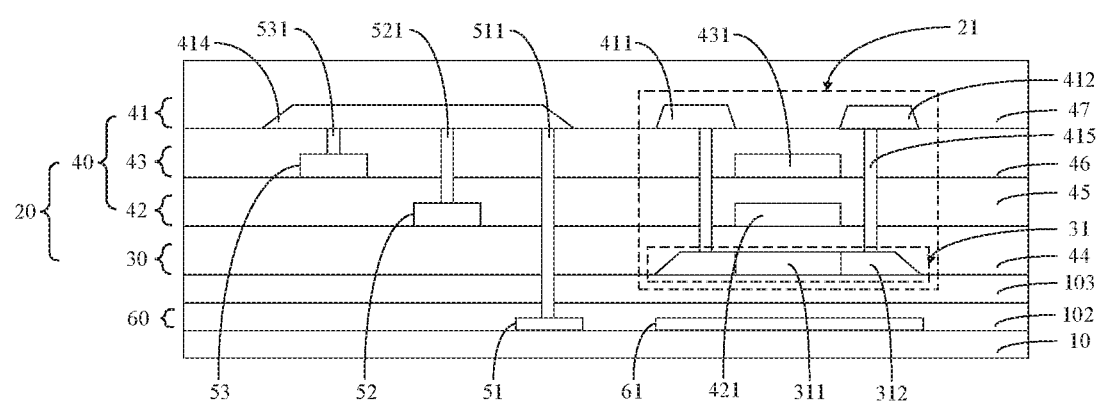

Referring to FIG. 9I, the method of manufacturing the display panel 100 can further include: disposing the first resistance-reduction wire 51 on the substrate 10; disposing the second resistance-reduction wire 52 on the first resistance-reduction wire 51; and disposing a third resistance-reduction wire 53 on the second resistance-reduction wire 52.

The first resistance-reduction wire 51 is disposed on the same layer as the shading layer 60, the second resistance-reduction wire 52 is disposed on the same layer as the first gate electrode layer 42, and the second resistance-reduction wire 52 is disposed on the same layer as the second gate electrode layer 43.

In the present embodiment, the third resistance-reduction wire 53 is parallel to the first resistance-reduction wire 51 and the second resistance-reduction wire 52.

In the present embodiment, the first resistance-reduction wire 51, the second resistance-reduction wire 52, and the third resistance-reduction wire 53 are perpendicular to the power drive wire 414, and are electrically connected to the power drive wire 414 by through holes respectively corresponding thereto. As a result, resistance value of the digital signal wire 413 is reduced. The amount and the position of the resistance-reduction wire 50 can be decided according to space and structure of layers.

The display panel further includes a light-emitting device layer (not shown) and an encapsulation layer (not shown) which are disposed on the planarization layer.

The present invention further provides a display module including the above display panel. A working principle of the display module is similar to the display panel, which will not be described here.

The present invention provides a display panel and a method of manufacturing same, and a display module. The display panel includes a substrate; a signal wire layer disposed on the substrate. The signal wire layer includes a gate electrode layer and a source/drain electrode layer. The gate electrode includes a gate electrode and a scanning signal wire. The source/drain electrode layer includes a source electrode, a drain electrode, and a power drive wire. The display panel further includes a resistance-reduction wire disposed between the substrate and the source/drain electrode layer. The resistance-reduction wire is electrically connected to the power drive wire by a through hole. In the present invention, at least one resistance-reduction wire is added to a display panel and connected to a power drive wire by a through hole. The resistance-reduction wire and the power drive wire form a grid structure, which is a parallel circuit, to transmit digital signals, thereby reducing resistance of metal wires, which are used for transmitting signals, of the display panel, decreasing a drop voltage, increasing uniformity of brightness of the display panel, and further alleviating an abnormality of open-circuit due to breakage of the metal lines.

In summary, the present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
a substrate; and
a scanning signal wire layer disposed on the substrate, wherein the scanning signal wire layer comprises a gate electrode layer and a source/drain electrode layer;
wherein the gate electrode layer comprises a gate electrode and a scanning signal wire;
wherein the source/drain electrode layer comprises a source electrode, a drain electrode, and a power drive wire;
wherein the display panel further comprises at least one resistance-reduction wire disposed between the substrate and the source/drain electrode layer, and a shading layer; and
wherein the at least one resistance-reduction wire is electrically connected to the power drive wire by a through hole and comprises a first resistance reduction wire;
wherein the first resistance-reduction wire is electrically connected to the power drive wire by a first through hole and is parallel to the scanning signal wire, the shading layer is disposed between the substrate and the gate electrode layer, and the first resistance-reduction wire is disposed on a same layer as the shading layer.

2. The display panel of claim 1, wherein the first resistance-reduction wire is disposed on a same layer as the scanning signal wire.

3. The display panel of claim 1, wherein the scanning signal wire layer comprises:
a first gate electrode layer comprising at least one first gate electrode and a scanning signal wire;
a second gate electrode layer disposed on the first gate electrode layer; wherein the second gate electrode layer comprises at least one second gate electrode disposed corresponding to the first gate electrode;
wherein the first gate electrode and the second gate electrode form a storage capacitor; and
wherein the first resistance-reduction wire is disposed on a same layer as the second gate electrode.

4. The display panel of claim 3, wherein the second gate electrode layer further comprises a reset signal wire;
wherein the reset signal wire is parallel to the scanning signal wire; and
wherein the first resistance-reduction wire is disposed between edge lines of two adjacent pixel units and the reset signal wire.

5. The display panel of claim 1, wherein the display panel further comprises a second resistance-reduction wire;
wherein the first resistance-reduction wire is disposed on a same layer as one of a shading layer, a first gate electrode layer, and a second gate electrode layer;
wherein the second resistance-reduction wire is disposed on a same layer as one of the shading layer, the first gate electrode layer, and the second gate electrode layer;
wherein the first resistance-reduction wire and the second resistance-reduction wire are disposed on different layers; and
wherein the second resistance-reduction wire is electrically connected to the power drive wire by a second through hole.

6. The display panel of claim 5, wherein the display panel further comprises a third resistance-reduction wire;
wherein the third resistance-reduction wire is disposed on a same layer as one of the shading layer, the first gate electrode layer, and the second gate electrode layer;

wherein the first resistance-reduction wire, the second resistance-reduction wire, and the third resistance-reduction wire are disposed on different layers; and wherein the third resistance-reduction wire is electrically connected to the power drive wire by a third through hole.

7. A method of manufacturing a display panel, comprising a plurality of steps of:

step 10: providing a substrate;

step 20: disposing a first metal layer on the substrate, and patterning the first metal layer to form a gate electrode and a scanning signal wire; and step 30: disposing a third metal layer on the first metal layer, and patterning the third metal layer to form a source electrode, a drain electrode, and a power drive wire;

wherein the method further comprises a step of:

disposing at least one resistance-reduction wire between the substrate and the third metal layer;

wherein the at least one resistance-reduction wire is electrically connected to the power drive wire by a through hole and comprises a first resistance-reduction wire;

wherein the first resistance-reduction wire is electrically connected to the power drive wire by a first through hole and is parallel to the scanning signal wire; and wherein a fourth metal layer is disposed on the substrate to form a shading layer and the first resistance-reduction wire by a patterning process before the step of disposing a first metal layer on the substrate.

8. The method of claim 7, wherein the step 20 comprises a plurality of steps of:

step 201: disposing the first metal layer on the substrate; and step 202: patterning the first metal layer to form at least one first gate electrode, the scanning signal wire, and the first resistance-reduction wire.

9. The method of claim 8, wherein the step 20 comprises a plurality of steps of:

step 211: disposing the first metal layer on the substrate;

step 212: patterning the first metal layer to form at least one first gate electrode and the scanning signal wire;

step 213: disposing a second metal layer on the first metal layer; and step 214: patterning the second metal layer to form at least one second gate electrode and the first resistance-reduction wire;

wherein the first gate electrode and the second gate electrode are disposed corresponding to each other; and wherein the first gate electrode and the second gate electrode form a storage capacitor.

10. The method of claim 9, wherein the step 214 comprises a step of:

patterning the second metal layer to form at least one second gate electrode, the first resistance-reduction wire, and a reset signal wire;

wherein the reset signal wire is parallel to the scanning signal wire; and wherein the first resistance-reduction wire is disposed between edge lines of two adjacent pixel units and the reset signal wire.

11. The method of claim 7, wherein the step of disposing at least one resistance-reduction wire between the substrate and the third metal layer comprises a plurality of steps of:

disposing the first resistance-reduction wire on the substrate; and disposing a second resistance-reduction wire on the first resistance-reduction wire;

wherein the first resistance-reduction wire is disposed on a same layer as a shading layer, and the second resistance-reduction wire is disposed on a same layer as a first gate electrode layer or a second gate electrode layer; or wherein the first resistance-reduction wire is disposed on a same layer as the first gate electrode layer, and the second resistance-reduction wire is disposed on a same layer as the second gate electrode layer; and wherein the first resistance-reduction wire is electrically connected to the power drive wire by a first through hole, and the second resistance-reduction wire is electrically connected to the power drive wire by a second through hole.

12. The method of claim 7, wherein the step of disposing at least one resistance-reduction wire between the substrate and the third metal layer comprises a plurality of steps of:

disposing the first resistance-reduction wire on the substrate;

disposing a second resistance-reduction wire on the first resistance-reduction wire; and disposing a third resistance-reduction wire on the second resistance-reduction wire;

wherein the first resistance-reduction wire is disposed on a same layer as a shading layer, the second resistance-reduction wire is disposed on a same layer as a first gate electrode layer, and the second resistance-reduction wire is disposed on a same layer as a second gate electrode layer.

13. A display module, comprising:

a display panel; and a polarizing layer and a cover layer disposed on the display panel;

wherein the display panel comprises a substrate, and a scanning signal wire layer disposed on the substrate;

wherein the scanning signal wire layer comprises a gate electrode layer and a source/drain electrode layer;

wherein the gate electrode layer comprises a gate electrode and a scanning signal wire;

wherein the source/drain electrode layer comprises a source electrode, a drain electrode, and a power drive wire; and wherein at least one resistance-reduction wire is electrically connected to the power drive wire by a through hole and comprises a first resistance-reduction wire and a second resistance-reduction wire;

wherein the first resistance-reduction wire is electrically connected to the power drive wire by a first through hole, and the first resistance-reduction wire is parallel to the scanning signal wire;

wherein the first resistance-reduction wire is disposed on a same layer as one of a shading layer, a first gate electrode layer, and a second gate electrode layer;

wherein the second resistance-reduction wire is disposed on a same layer as one of the shading layer, the first gate electrode layer, and the second gate electrode layer;

wherein the first resistance-reduction wire and the second resistance-reduction wire are disposed on different layers; and wherein the second resistance-reduction wire is electrically connected to the power drive wire by a second through hole.

14. The display module of claim 13, wherein the display panel further comprises a third resistance-reduction wire;

wherein the third resistance-reduction wire is disposed on a same layer as one of the shading layer, the first gate electrode layer, and the second gate electrode layer;

wherein the first resistance-reduction wire, the second resistance-reduction wire, and the third resistance-reduction wire are disposed on different layers; and wherein the third resistance-reduction wire is electrically connected to the power drive wire by a third through hole.

* * * * *